(12) United States Patent
Verghese

(10) Patent No.: US 10,371,770 B2
(45) Date of Patent: Aug. 6, 2019

(54) RF RECEIVING COIL UNIT FOR MRI APPARATUS

(71) Applicant: Samsung Electronics Co., Ltd, Gyeonggi-do (KR)

(72) Inventor: George Verghese, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 238 days.

(21) Appl. No.: 15/401,081

(22) Filed: Jan. 8, 2017

(65) Prior Publication Data

US 2017/0199256 A1  Jul. 13, 2017

(30) Foreign Application Priority Data

Jan. 8, 2016 (KR) .................. 10-2016-0002803

(51) Int. Cl.
| | | |
|---|---|---|
| *G01V 3/00* | (2006.01) | |
| *G01R 33/36* | (2006.01) | |
| *G01R 15/14* | (2006.01) | |
| *G01R 19/165* | (2006.01) | |

(52) U.S. Cl.
CPC ....... *G01R 33/3621* (2013.01); *G01R 15/146* (2013.01); *G01R 19/165* (2013.01)

(58) Field of Classification Search
CPC .............. G01R 33/543; G01R 33/5659; G01R 33/3415; G01R 33/36
USPC ....................................................... 324/309
See application file for complete search history.

(56) References Cited

U.S. PATENT DOCUMENTS

| | | | |
|---|---|---|---|
| 6,710,597 B2 | 3/2004 | Reykowski et al. | |
| 7,728,594 B2 | 6/2010 | Vernickel et al. | |
| 8,378,683 B2 | 2/2013 | Gudino et al. | |
| 2009/0195324 A1* | 8/2009 | Li | H01F 19/04 333/25 |
| 2013/0214784 A1* | 8/2013 | Dietz | G01R 33/3854 324/314 |
| 2014/0197836 A1* | 7/2014 | Hamamura | G01R 33/44 324/318 |
| 2014/0285200 A1 | 9/2014 | Bailey | |
| 2015/0015254 A1* | 1/2015 | Zhu | A61B 5/055 324/309 |

FOREIGN PATENT DOCUMENTS

| | | |
|---|---|---|
| CN | 103852743 | 6/2014 |
| CN | 103890600 | 6/2014 |
| JP | 2007533392 A | 11/2007 |
| JP | 2014133135 | 7/2014 |

(Continued)

OTHER PUBLICATIONS

Notice of Allowance dated Apr. 3, 2017 in connection with Korean Patent Application No. 10-2016-0002803.

(Continued)

*Primary Examiner* — Walter L Lindsay, Jr.
*Assistant Examiner* — Frederick Wenderoth

(57) ABSTRACT

An embodiment provides a radio frequency (RF) receiving coil unit for a magnetic resonance imaging (MRI) system. The RF receiving coil unit includes an RF coil and a circuit. The circuit is configured to monitor a current flowing through the RF coil by using electromagnetic coupling between the RF coil and the first coil.

15 Claims, 7 Drawing Sheets

(56) References Cited

FOREIGN PATENT DOCUMENTS

KR      20130029931 A      3/2013

OTHER PUBLICATIONS

Notice of Non-Final Rejection dated Nov. 17, 2016 in connection with Korean Applicaion No. 10-2016-0002803, 14 pages.
L. Kyle Hedges, "A Fuse for Magnetic Resonance Imaging Probes", National Institutes of Health, Biomedical and Instrumentation Branch, Betheseda, Maryland, Jul. 20, 1988, 4 pages.

* cited by examiner

RF RECEIVING COIL UNIT FOR MRI APPARATUS

CROSS-REFERENCE TO RELATED APPLICATION(S) AND CLAIM OF PRIORITY

The present application is related to and claims the benefit of Korean Patent Application No. 10-2016-0002803, filed on Jan. 8, 2016, in the Korean Intellectual Property Office, the disclosure of which is incorporated herein in its entirety by reference.

TECHNICAL FIELD

The present disclosure relates to radio frequency (RF) receiving coil units for magnetic resonance imaging (MM) apparatuses.

BACKGROUND

A medical imaging apparatus is an apparatus for obtaining images of internal structures of an object. A medical imaging apparatus that is a noninvasive investigation apparatus images, processes, and shows structural details in a body, internal structures, and fluid flow to a user. A user such as a doctor may diagnose a health condition and a disease of a patient by using a medical image output from a medical imaging apparatus.

Examples of a medical imaging apparatus include a magnetic resonance imaging (MRI) apparatus for providing a magnetic resonance (MR) image, a computed tomography (CT) apparatus, an X-ray apparatus, and an ultrasound diagnosis apparatus.

In detail, an MRI apparatus that is an apparatus for imaging a subject by using a magnetic field is widely used to accurately diagnose a disease because the MM apparatus shows not only bones but also the spine, joints, nerves, ligaments, and the like, at desired angles in a three-dimensional (3D) manner.

An MRI apparatus obtains an MR signal by using a high-frequency multi-coil including radio frequency (RF) coils, a permanent magnet, and a gradient coil. The MM apparatus reconstructs an MR image by sampling the MR signal.

When a medical imaging apparatus images an object, excessive current flowing through the medical imaging apparatus may damage a patient's body. Accordingly, an apparatus for monitoring and adjusting an intensity of current is necessary. In an embodiment, when excessive current flows due to electromagnetic induction through an RF receiving coil that is close to the patient's body, the patient's body may be burned.

Examples of a method of adjusting an intensity of current flowing through an RF receiving coil include a method of maintaining current flowing through a circuit at a low level by using a decoupling circuit having a high independence. However, since the decoupling circuit has an impendence that varies according to an RF, over-current may be generated according to a frequency of the MRI apparatus.

Accordingly, one of the most commonly used methods is a method using a fuse. In the method using the fuse, a circuit may be turned off when over-current is generated.

SUMMARY

To address the above-discussed deficiencies, it is a primary object to provide radio frequency (RF) receiving coil units that may monitor an intensity of current flowing through an RF receiving coil.

Additional aspects will be set forth in part in the description which follows and, in part, will be apparent from the description, or may be learned by practice of the presented embodiments.

According to an aspect of an embodiment, a radio frequency (RF) receiving coil unit for a magnetic resonance imaging (MM) system includes an RF coil and a circuit. The circuit is configured to monitor current flowing through the RF coil by using electromagnetic coupling between the RF coil and the coil.

The circuit may measure a value of the current.

The circuit may compare an intensity of the current with a predetermined threshold value.

The RF receiving coil unit may further include another circuit configured to, when the intensity of the current exceeds the predetermined threshold value, transmit a signal for stopping scanning.

The RF receiving coil unit may further include a transformer configured to electromagnetically connect the RF coil and the circuit.

The circuit may include a probe including a loop, and may monitor current flowing through the RF coil by using magnetic coupling between the RF coil and the loop.

The circuit may include a circuit configured to measure a voltage drop across a capacitor included in the RF coil.

According to an aspect of another embodiment, a radio frequency (RF) receiving coil unit for a magnetic resonance imaging (MRI) system includes an RF coil, a cable configured to transmit a signal received by the RF coil, and a circuit. The circuit is configured to monitor current flowing through the cable by using electromagnetic coupling between the cable and the circuit.

The circuit may measure a value of the current.

The circuit may compare an intensity of the current with a predetermined threshold value.

The RF receiving coil unit may further include another circuit configured to, when the intensity of the current exceeds the predetermined threshold value, transmit a signal for stopping scanning.

The RF receiving coil unit may further include a transformer configured to electromagnetically connect the cable and the circuit.

The circuit may include a probe including a loop, and may monitor current flowing through the RF coil by using magnetic coupling between the cable and the loop.

The circuit may include a circuit configured to measure a voltage drop across a capacitor included in the cable.

According to yet another aspect of another embodiment, a method for a magnetic resonance imaging (MM) includes transmitting, by a cable, a signal received by a radio frequency (RF) coil and monitoring, by a circuit, current flowing through the cable by using electromagnetic coupling between the cable and the circuit.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1:
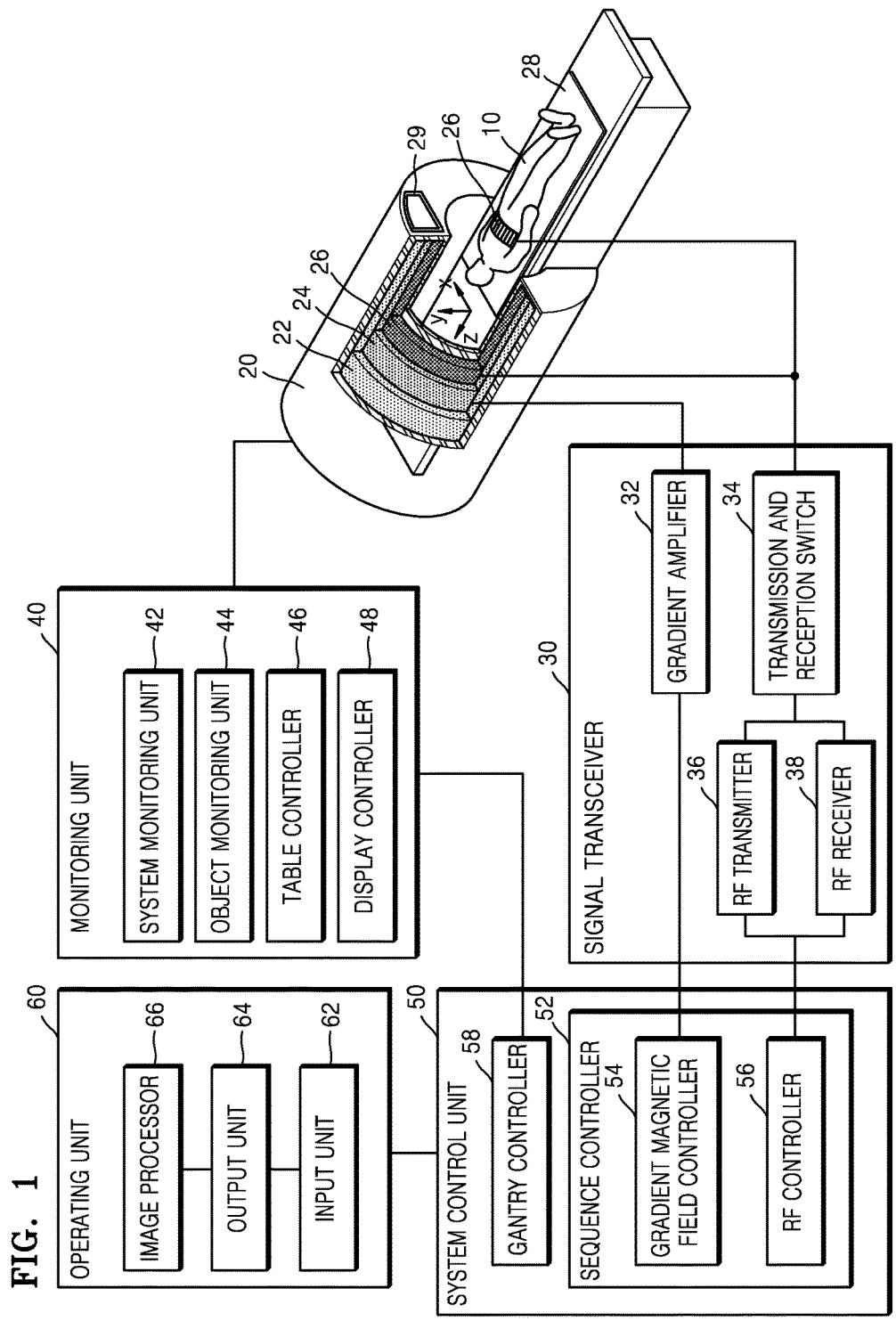
FIG. 1 illustrates a block diagram of a general magnetic resonance imaging (MRI) system.

FIGS. 1 through 9B, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged RF receiving coil unit or method.

The attached drawings for illustrating exemplary embodiments of the present disclosure are referred to in order to gain a sufficient understanding of the present disclosure, the merits thereof, and the objectives accomplished by the implementation of the present disclosure. In this regard, the present embodiments may have different forms and should not be construed as being limited to the descriptions set forth herein. Rather, these embodiments are provided such that this disclosure will be thorough and complete and will fully convey the concept of the present embodiments to one of ordinary skill in the art, and the present disclosure will only be defined by the appended claims.

Hereinafter, the terms used in the specification will be briefly described, and then the present disclosure will be described in detail.

The terms used in this specification are those general terms currently widely used in the art in consideration of functions regarding the inventive concept, but the terms may vary according to the intention of those of ordinary skill in the art, precedents, or new technology in the art. Also, some terms may be arbitrarily selected by the applicant, and in this example, the meaning of the selected terms will be described in detail in the detailed description of the present specification. Thus, the terms used herein have to be defined based on the meaning of the terms together with the description throughout the specification.

When a part "includes" or "comprises" an element, unless there is a particular description contrary thereto, the part can further include other elements, not excluding the other elements. Also, the term "unit" in the embodiments means a software component or hardware component such as a field-programmable gate array (FPGA) or an application-specific integrated circuit (ASIC), and performs a specific function. However, the term "unit" is not limited to software or hardware. The "unit" may be formed so as to be in an addressable storage medium, or may be formed so as to operate one or more processors. Thus, for example, the term "unit" may refer to components such as software components, object-oriented software components, class components, and task components, and may include processes, functions, attributes, procedures, subroutines, segments of program code, drivers, firmware, micro codes, circuits, data, a database, data structures, tables, arrays, or variables. A function provided by the components and "units" may be associated with the smaller number of components and "units", or may be divided into additional components and "units".

Reference will now be made in detail to embodiments, examples of which are illustrated in the accompanying drawings. In the following description, well-known functions or constructions are not described in detail so as not to obscure the embodiments with unnecessary detail.

Throughout the specification, an "image" may denote multi-dimensional data composed of discrete image elements (for example, pixels in a two-dimensional image and voxels in a three-dimensional image). For example, the image may be a medical image of an object captured by an X-ray apparatus, a computed tomography (CT) apparatus, a magnetic resonance imaging (MRI) apparatus, an ultrasound diagnosis apparatus, or another medical imaging apparatus.

Furthermore, in the present specification, an "object" may be a human, an animal, or a part of a human or animal. For example, the object may be an organ (e.g., the liver, the heart, the womb, the brain, a breast, or the abdomen), a blood vessel, or a combination thereof. The object may be a phantom. The phantom means a material having a density, an effective atomic number, and a volume that are approximately the same as those of an organism. For example, the phantom may be a spherical phantom having properties similar to the human body.

Furthermore, in the present specification, a "user" may be, but is not limited to, a medical expert, such as a medical doctor, a nurse, a medical laboratory technologist, or a technician who repairs a medical apparatus.

Furthermore, in the present specification, an "MR image" refers to an image of an object obtained by using the nuclear magnetic resonance principle.

Furthermore, in the present specification, a "pulse sequence" refers to continuity of signals repeatedly applied by an MM apparatus. The pulse sequence may include a time parameter of a radio frequency (RF) pulse, for example, repetition time (TR) or echo time (TE).

Furthermore, in the present specification, a "pulse sequence schematic diagram" shows an order of events that occur in an MRI apparatus. For example, the pulse sequence schematic diagram may be a diagram showing an RF pulse, a gradient magnetic field, an MR signal, or the like according to time.

An MRI system is an apparatus for acquiring a sectional image of a part of an object by expressing, in a contrast comparison, a strength of an MR signal with respect to a radio frequency (RF) signal generated in a magnetic field having a specific strength. For example, if an RF signal that only resonates a specific atomic nucleus (for example, a hydrogen atomic nucleus) is emitted for an instant toward the object placed in a strong magnetic field and then such emission stops, an MR signal is emitted from the specific atomic nucleus, and thus the MRI system may receive the MR signal and acquire an MR image. The MR signal denotes an RF signal emitted from the object. An intensity of the MR signal may be determined according to a density of a predetermined atom (for example, hydrogen) of the object, a relaxation time T1, a relaxation time T2, and a flow of blood or the like.

MRI systems include characteristics different from those of other imaging apparatuses. Unlike imaging apparatuses such as CT apparatuses that acquire images according to a direction of detection hardware, MM systems may acquire 2D images or 3D volume images that are oriented toward an optional point. MM systems do not expose objects or examiners to radiation, unlike CT apparatuses, X-ray apparatuses, position emission tomography (PET) apparatuses, and single photon emission CT (SPECT) apparatuses, may acquire images having high soft tissue contrast, and may acquire neurological images, intravascular images, musculoskeletal images, and oncologic images that are used to precisely capturing abnormal tissues.

As used herein, the term "and/or" includes any and all combinations of one or more of the associated listed items. Expressions such as "at least one of," when preceding a list of elements, modify the entire list of elements and do not modify the individual elements of the list.

FIG. 1 illustrates a block diagram of a general MM system according to an embodiment. Referring to FIG. 1, the general MRI system may include a gantry 20, a signal transceiver 30, a monitoring unit 40, a system control unit 50, and an operating unit 60.

The gantry 20 prevents external emission of electromagnetic waves generated by a main magnet 22, a gradient coil 24, and an RF coil 26. A magnetostatic field and a gradient magnetic field are formed in a bore in the gantry 20, and an RF signal is emitted toward an object 10.

The main magnet 22, the gradient coil 24, and the RF coil 26 may be arranged in a predetermined direction of the gantry 20. The predetermined direction may be a coaxial cylinder direction. The object 10 may be disposed on a table 28 that is capable of being inserted into a cylinder along a horizontal axis of the cylinder.

The main magnet 22 generates a magnetostatic field or a static magnetic field for aligning magnetic dipole moments of atomic nuclei of the object 10 in a constant direction. A precise and accurate MR image of the object 10 may be obtained due to a magnetic field generated by the main magnet 22 being strong and uniform.

The gradient coil 24 includes X, Y, and Z coils for generating gradient magnetic fields in X-, Y-, and Z-axis directions crossing each other at right angles. The gradient coil 24 may provide location information of each region of the object 10 by differently inducing resonance frequencies according to the regions of the object 10.

The RF coil 26 may emit an RF signal toward a patient and receive an MR signal emitted from the patient. In detail, the RF coil 26 may transmit, toward atomic nuclei included in the patient and having precessional motion, an RF signal having the same frequency as that of the precessional motion, stop transmitting the RF signal, and then receive an MR signal emitted from the atomic nuclei included in the patient.

For example, in order to transit an atomic nucleus from a low energy state to a high energy state, the RF coil 26 may generate and apply an electromagnetic wave signal that is an RF signal corresponding to a type of the atomic nucleus, to the object 10. When the electromagnetic wave signal generated by the RF coil 26 is applied to the atomic nucleus, the atomic nucleus may transit from the low energy state to the high energy state. Then, when electromagnetic waves generated by the RF coil 26 disappear, the atomic nucleus to which the electromagnetic waves were applied transits from the high energy state to the low energy state, thereby emitting electromagnetic waves having a Lamor frequency. In other words, when the applying of the electromagnetic wave signal to the atomic nucleus is stopped, an energy level of the atomic nucleus is changed from a high energy level to a low energy level, and thus the atomic nucleus may emit electromagnetic waves having a Lamor frequency. The RF coil 26 may receive electromagnetic wave signals from atomic nuclei included in the object 10.

The RF coil 26 may be realized as one RF transmitting and receiving coil having both a function of generating electromagnetic waves each having an RF that corresponds to a type of an atomic nucleus and a function of receiving electromagnetic waves emitted from an atomic nucleus. Alternatively, the RF coil 26 may be realized as a transmission RF coil having a function of generating electromagnetic waves each having an RF that corresponds to a type of an atomic nucleus, and a reception RF coil having a function of receiving electromagnetic waves emitted from an atomic nucleus.

The RF coil 26 may be fixed to the gantry 20 or may be detachable. When the RF coil 26 is detachable, the RF coil 26 may be an RF coil for a part of the object 10, such as a head RF coil, a chest RF coil, a leg RF coil, a neck RF coil, a shoulder RF coil, a wrist RF coil, or an ankle RF coil.

The RF coil 26 may communicate with an external apparatus via wires and/or wirelessly, and may also perform dual tune communication according to a communication frequency band.

The RF coil 26 may be a birdcage coil, a surface coil, or a transverse electromagnetic (TEM) coil according to structures.

The RF coil 26 may be a transmission exclusive coil, a reception exclusive coil, or a transmission and reception coil according to methods of transmitting and receiving an RF signal.

The RF coil 26 may be an RF coil having various numbers of channels, such as 16 channels, 32 channels, 72 channels, and 144 channels.

The gantry 20 may further include a display 29 disposed outside the gantry 20 and a display (not shown) disposed inside the gantry 20. The gantry 20 may provide predetermined information to the user or the object 10 through the display 29 and the display respectively disposed outside and inside the gantry 20.

The signal transceiver 30 may control the gradient magnetic field formed inside the gantry 20, i.e., in the bore, according to a predetermined MR sequence, and control transmission and reception of an RF signal and an MR signal.

The signal transceiver 30 may include a gradient amplifier 32, a transmission and reception switch 34, an RF transmitter 36, and an RF receiver 38.

The gradient amplifier 32 drives the gradient coil 24 included in the gantry 20, and may supply a pulse signal for generating a gradient magnetic field to the gradient coil 24 under the control of a gradient magnetic field controller 54. By controlling the pulse signal supplied from the gradient amplifier 32 to the gradient coil 24, gradient magnetic fields in X-, Y-, and Z-axis directions may be synthesized.

The RF transmitter 36 and the RF receiver 38 may drive the RF coil 26. The RF transmitter 36 may supply an RF pulse in a Lamor frequency to the RF coil 26, and the RF receiver 38 may receive an MR signal received by the RF coil 26.

The transmission and reception switch 34 may adjust transmitting and receiving directions of the RF signal and the MR signal. For example, the transmission and reception switch 34 may emit the RF signal toward the object 10 through the RF coil 26 during a transmission mode, and receive the MR signal from the object 10 through the RF coil 26 during a reception mode. The transmission and reception switch 34 may be controlled by a control signal output by an RF controller 56.

The monitoring unit 40 may monitor or control the gantry 20 or devices mounted on the gantry 20. The monitoring unit 40 may include a system monitoring unit 42, an object monitoring unit 44, a table controller 46, and a display controller 48.

The system monitoring unit 42 may monitor and control a state of the magnetostatic field, a state of the gradient magnetic field, a state of the RF signal, a state of the RF coil 26, a state of the table 28, a state of a device measuring body information of the object 10, a power supply state, a state of a thermal exchanger, and a state of a compressor.

The object monitoring unit 44 monitors a state of the object 10. In detail, the object monitoring unit 44 may include a camera for monitoring a movement or position of the object 10, a respiration measurer for measuring the respiration of the object 10, an electrocardiogram (ECG) measurer for measuring the electrical activity of the object 10, or a temperature measurer for measuring a temperature of the object 10.

The table controller 46 controls a movement of the table 28 where the object 10 is positioned. The table controller 46 may control the movement of the table 28 according to a sequence control of the system control unit 50. For example, during moving imaging of the object 10, the table controller 46 may continuously or discontinuously move the table 28 according to the sequence control of the system control unit 50, and thus the object 10 may be photographed in a field of view (FOV) larger than that of the gantry 20.

The display controller 48 controls the display 29 disposed outside the gantry 20 and the display disposed inside the gantry 20. In detail, the display controller 48 may control the display 29 and the display to be on or off, and may control a screen image to be output on the display 29 and the display. Also, when a speaker is located inside or outside the gantry 20, the display controller 48 may control the speaker to be on or off, or may control sound to be output via the speaker.

The system control unit 50 may include the sequence controller 52 for controlling a sequence of signals formed in the gantry 20, and a gantry controller 58 for controlling the gantry 20 and the devices mounted on the gantry 20.

The sequence controller 52 may include the gradient magnetic field controller 54 for controlling the gradient amplifier 32, and the RF controller 56 for controlling the RF transmitter 36, the RF receiver 38, and the transmission and reception switch 34. The sequence controller 52 may control the gradient amplifier 32, the RF transmitter 36, the RF receiver 38, and the transmission and reception switch 34 according to a pulse sequence received from the operating unit 60. Here, the pulse sequence includes all information used to control the gradient amplifier 32, the RF transmitter 36, the RF receiver 38, and the transmission and reception switch 34. For example, the pulse sequence may include information about a strength, an application time, and application timing of a pulse signal applied to the gradient coil 24.

The operating unit 60 may request the system control unit 50 to transmit pulse sequence information while controlling an overall operation of the MRI system.

The operating unit 60 may include an image processor 62 for receiving and processing the MR signal received by the RF receiver 38, an output unit 64, and an input unit 66.

The image processor 62 may process the MR signal received from the RF receiver 38 so as to generate MR image data of the object 10.

The image processor 62 receives the MR signal received by the RF receiver 38 and performs any one of various signal processes, such as amplification, frequency transformation, phase detection, low frequency amplification, and filtering, on the received MR signal.

The image processor 62 may arrange digital data in a k space (for example, also referred to as a Fourier space or a frequency space) of a memory, and rearrange the digital data into image data via 2D or 3D Fourier transformation.

The image processor 62 may perform a composition process or a difference calculation process on the image data. The composition process may be an addition process performed on a pixel or a maximum intensity projection (MIP) process performed on a pixel. The image processor 62 may store not only the rearranged image data but also image data on which a composition process or a difference calculation process is performed, in a memory (not shown) or an external server.

The image processor 62 may perform any of the signal processes on the MR signal in parallel. For example, the image processor 62 may perform a signal process on a plurality of MR signals received by a multi-channel RF coil in parallel so as to rearrange the plurality of MR signals into image data.

The output unit 64 may output image data generated or rearranged by the image processor 62 to the user. The output unit 64 may also output information used for the user to manipulate the MRI system, such as a user interface (UI), user information, or object information. The output unit 64 may be a speaker, a printer, a cathode-ray tube (CRT) display, a liquid crystal display (LCD), a plasma display panel (PDP), an organic light-emitting device (OLED) display, a field emission display (FED), a light-emitting diode (LED) display, a vacuum fluorescent display (VFD), a digital light processing (DLP) display, a flat panel display (FPD), a 3-dimensional (3D) display, a transparent display, or any one of other various output devices that are well known to one of ordinary skill in the art.

The user may input object information, parameter information, a scan condition, a pulse sequence, or information about image composition or difference calculation by using the input unit 66. The input unit 66 may be a keyboard, a mouse, a track ball, a voice recognizer, a gesture recognizer, a touch screen, or any one of other various input devices that are well known to one of ordinary skill in the art.

The signal transceiver 30, the monitoring unit 40, the system control unit 50, and the operating unit 60 are separate components in FIG. 1, but it will be obvious to one of ordinary skill in the art that respective functions of the signal transceiver 30, the monitoring unit 40, the system control unit 50, and the operating unit 60 may be performed by another component. For example, the image processor 62 converts the MR signal received from the RF receiver 38 into a digital signal in FIG. 1, but alternatively, the conversion of the MR signal into the digital signal may be performed by the RF receiver 38 or the RF coil 26.

The gantry 20, the RF coil 26, the signal transceiver 30, the monitoring unit 40, the system control unit 50, and the operating unit 60 may be connected to each other by wire or wirelessly, and when they are connected wirelessly, the MRI system may further include an apparatus (not shown) for synchronizing clock signals therebetween. Communication between the gantry 20, the RF coil 26, the signal transceiver 30, the monitoring unit 40, the system control unit 50, and the operating unit 60 may be performed by using a high-speed digital interface, such as low voltage differential signaling (LVDS), asynchronous serial communication, such as a universal asynchronous receiver transmitter (UART), a low-delay network protocol, such as error synchronous serial communication or a controller area network (CAN), optical communication, or any of other various communication methods that are well known to one of ordinary skill in the art.

Figure 2:
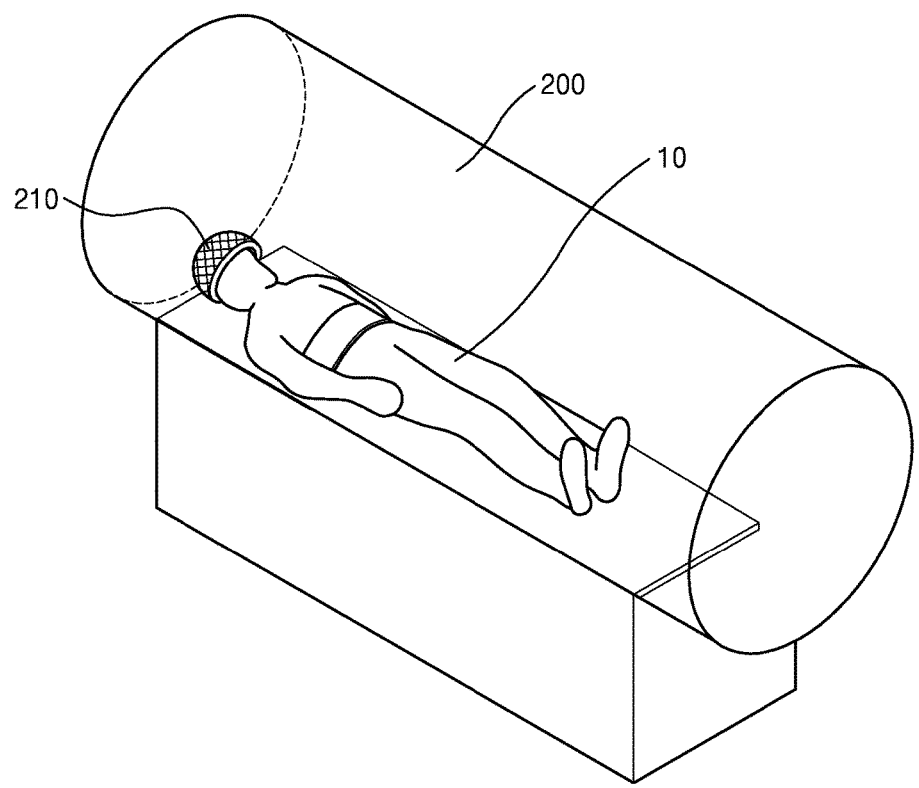
FIG. 2 illustrates a view of a structure of a radio frequency (RF) coil according to an embodiment.

FIG. 2 illustrates a view illustrating a structure of the RF coil 26 according to an embodiment. In an embodiment, the RF coil 26 of FIG. 1 may include an RF transmitting coil 200 and an RF receiving coil unit 210.

The RF transmitting coil 200 may be referred to as a body coil and is a big coil relatively far from the object 10. An RF receiving coil may be referred to as a local coil and is a coil close to each part of the object 10 to be imaged.

Although only the RF receiving coil unit 210 for capturing a brain MR image is illustrated in FIG. 2, a position and a shape of the RF receiving coil are not limited thereto. Examples of the RF receiving coil may include a head RF coil, a beast RF coil, a leg RF coil, a neck RF coil, a shoulder RF coil, a wrist RF coil, and an ankle RF coil.

The RF receiving coil unit 210 may include a plurality of RF receiving coils. Also, the RF receiving coil unit 210 may include an amplifier for amplifying a signal received by each of the RF receiving coils. Also, the RF receiving coil unit 210 may include a cable for transmitting a signal received by each of the RF receiving coils.

Figure 3:
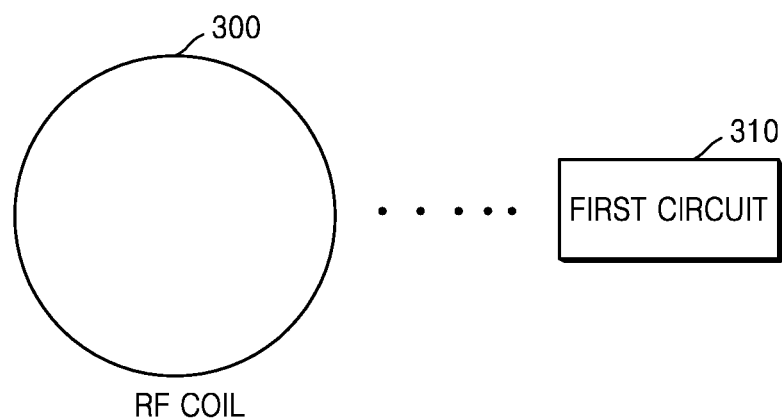
FIG. 3 illustrates a view of an RF receiving coil unit according to an embodiment.

FIG. 3 illustrates a view of the RF receiving coil unit 210 according to an embodiment. Referring to FIG. 3, the RF receiving coil unit 210 includes an RF coil 300 and a first circuit 310. In an embodiment, the RF receiving coil unit 210 may include a plurality of the RF coils 300 and the first circuit 310 corresponding to each of the RF coils 300.

In an embodiment, the first circuit 310 monitors current flowing through the RF coil 300. For example, the first circuit 310 may measure a value of current flowing through the RF coil 300. Also, the first circuit 310 may compare the measured value of the current with a predetermined threshold value.

In another embodiment, the first circuit 310 may not measure a value of current flowing through the RF coil 300. In the present embodiment, the first circuit 310 may compare an intensity of current flowing through the RF coil 300 with a predetermined threshold value.

For example, the first circuit 310 may not include a unit for measuring a value of current flowing through the RF coil 300, and may include a comparator for comparing an intensity of current flowing through the RF coil 300 with a predetermined threshold value.

The first circuit 310 monitors current flowing through the RF coil 300 by using electromagnetic coupling between the RF coil 300 and the first circuit 310. In the present specification, electromagnetic coupling includes at least one of electric coupling and magnetic coupling.

In an embodiment, the first circuit 310 may be connected by wire or wirelessly to the RF coil 300. For example, when the first circuit 310 monitors current flowing through the RF coil 300 by using electric coupling between the RF coil 300 and the first circuit 310, the first circuit 310 may be connected by wire to the RF coil 300.

In another embodiment, when the first circuit 310 monitors current flowing through the RF coil 300 by using magnetic coupling between the RF coil 300 and the first circuit 310, the first circuit 310 may be wirelessly connected to the RF coil 300.

In an embodiment, the RF coil 300 may include a circuit element such as a capacitor, an inductor, or a resistor. Also, the RF coil 300 may include an amplifier for amplifying a received signal.

Figure 4:
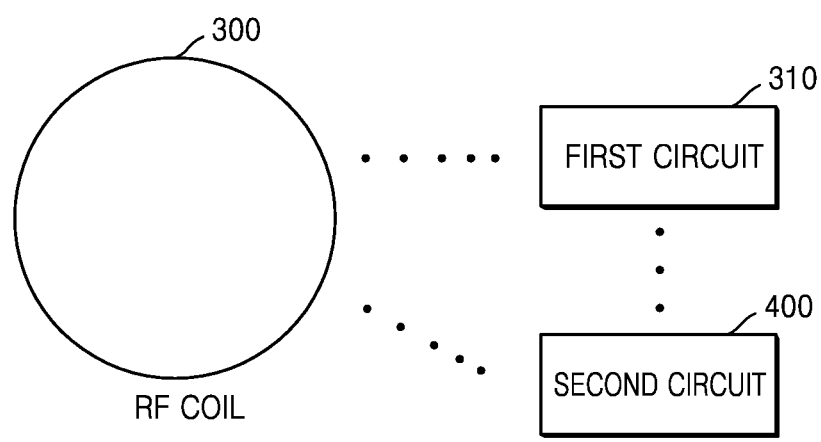
FIG. 4 illustrates a view of the RF receiving coil unit according to an embodiment.

FIG. 4 illustrates a view of the RF receiving coil unit 210 according to an embodiment. Referring to FIG. 4, the RF receiving coil unit 210 may include the RF coil 300, the first circuit 310, and a second circuit 400. In an embodiment, the RF receiving coil unit 210 may include a plurality of the RF coils 300. Also, the RF receiving coil unit 210 may include the second circuit 400 and the first circuit 310 corresponding to each of the RF coils 300.

FIG. 4 is a view illustrating a modification of the RF receiving coil unit 210 of FIG. 3. Accordingly, the description of the RF receiving coil unit 210 of FIG. 3 may apply to the RF receiving coil unit 210 of FIG. 4.

In an embodiment, the first circuit 310 may include a circuit for comparing an intensity of current flowing through the RF coil 300 with a predetermined threshold value. For example, the first circuit 310 may include a comparator. In an embodiment, the first circuit 310 may include a voltage comparator and a voltage-current converter. In another embodiment, the first circuit 310 may include a current comparator.

In an embodiment, the second circuit 400 may include a circuit for transmitting a signal for stopping scanning when an intensity of current monitored by the first circuit 310 exceeds a predetermined threshold value.

For example, the second circuit 400 may include a PIN bias switch. The first circuit 310 may transmit a bias control signal to the second circuit 400 according to a result obtained after comparing an intensity of current flowing through the RF coil 300 with a predetermined threshold value.

The second circuit 400 may transmit a signal for stopping scanning to the RF coil 300 according to the bias control signal received from the first circuit 310. The RF coil 300 may include a feedback circuit for stopping scanning when a stop signal is received from the second circuit 400.

Figure 5:
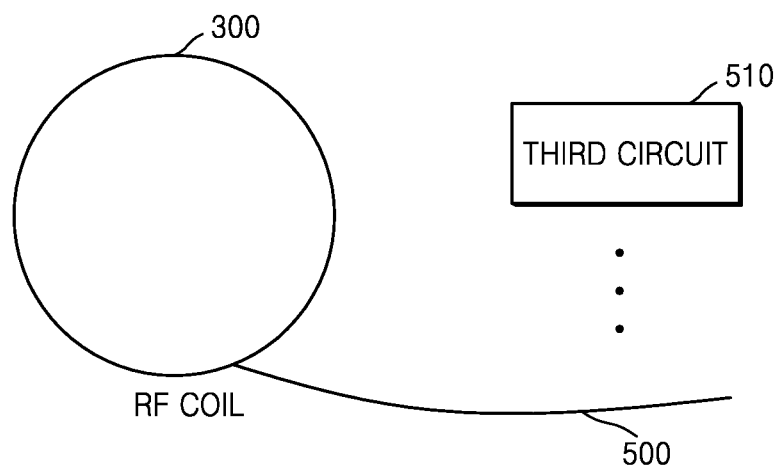
FIG. 5 illustrates a view of the RF receiving coil unit according to an embodiment.

FIG. 5 illustrates a view of the RF receiving coil unit 210 according to an embodiment. Referring to FIG. 5, the RF receiving coil unit 210 includes the RF coil 300, a cable 500, and a third circuit 510. In an embodiment, the RF receiving coil unit 210 may include a plurality of the RF coils 300. The RF receiving coil unit 210 may include the third circuit 510 and the cable 500 according to each of the RF coils 300.

The cable 500 transmits a signal received by the RF coil 300 to a medical imaging system. In an embodiment, the RF coil 300 may include an amplifier for amplifying a received signal. In this example, the cable 500 may transmit the amplified signal.

In an embodiment, the third circuit 510 monitors current flowing through the cable 500. For example, the third circuit 510 may measure a value of current flowing through the cable 500. Also, the third circuit 510 may compare the measured value of the current with a predetermined threshold value.

In another embodiment, the third circuit 510 may not measure a value of current flowing through the cable 500. In the present embodiment, the third circuit 510 may compare an intensity of current flowing through the cable 500 with a predetermined threshold value.

For example, the third circuit 510 may not include a unit for measuring a value of current flowing through the cable 500, and may include a comparator for comparing an intensity of current flowing through the cable 500 with a predetermined threshold value.

The third circuit 510 monitors current flowing through the cable 500 by using electromagnetic coupling between the cable 500 and the third circuit 510. In the present specification, electromagnetic coupling includes electric coupling and magnetic coupling.

In an embodiment, the third circuit 510 may be connected by wire or wirelessly to the cable 500. For example, when the third circuit 510 monitors current flowing through the cable 500 by using electric coupling between the cable 500 and the third circuit 510, the third circuit 510 may be connected by wire to the cable 500.

In another embodiment, when the third circuit 510 monitors current flowing through the cable 500 by using magnetic coupling between the cable 500 and the third circuit 510, the third circuit 510 may be wirelessly connected to the cable 500.

In an embodiment, the cable 500 may include a circuit element such as a capacitor, an inductor, or a resistor.

Figure 6:
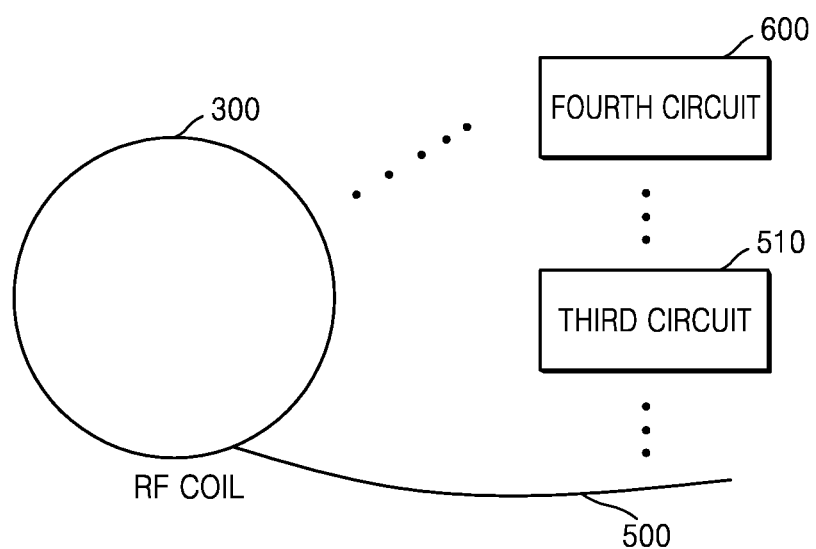
FIG. 6 illustrates a view of the RF receiving coil unit according to an embodiment.

FIG. 6 illustrates a view of the RF receiving coil unit 210 according to an embodiment. Referring to FIG. 6, the RF receiving coil unit 210 may include the RF coil 300, the cable 500, the third circuit 510, and a fourth circuit 600.

In an embodiment, the RF receiving coil unit 210 may include a plurality of the RF coils 300. Also, the RF receiving coil unit 210 may include the cable 500, the third circuit 510, and the fourth circuit 600 corresponding to each of the RF coils 300.

FIG. 6 is a view illustrating a modification of the RF receiving coil unit 210 of FIG. 5. Accordingly, the description of the RF receiving coil unit 210 of FIG. 5 may apply to the RF receiving coil unit 210 of FIG. 6.

In an embodiment, the third circuit 510 may include a circuit for comparing an intensity of current flowing through the cable 500 with a predetermined threshold value. For example, the third circuit 510 may include a comparator. In an embodiment, the third circuit 510 may include a voltage comparator and a voltage-current converter. In another embodiment, the third circuit 510 may include a current comparator.

In an embodiment, the fourth circuit 600 may include a circuit for transmitting a signal for stopping scanning when an intensity of current monitored by the third circuit 510 exceeds a predetermined threshold value.

For example, the fourth circuit 600 may include a PIN bias switch. The third circuit 510 may transmit a bias control signal to the fourth circuit 600 according to a result obtained after comparing an intensity of current flowing through the cable 500 with a predetermined threshold value.

The fourth circuit 600 may transmit a signal for stopping scanning to the RF coil 300 according to the bias control signal received from the third circuit 510. The RF coil 300 may include a feedback circuit for stopping scanning when the RF coil 300 receives a stop signal from the fourth circuit 600.

Figure 7A:
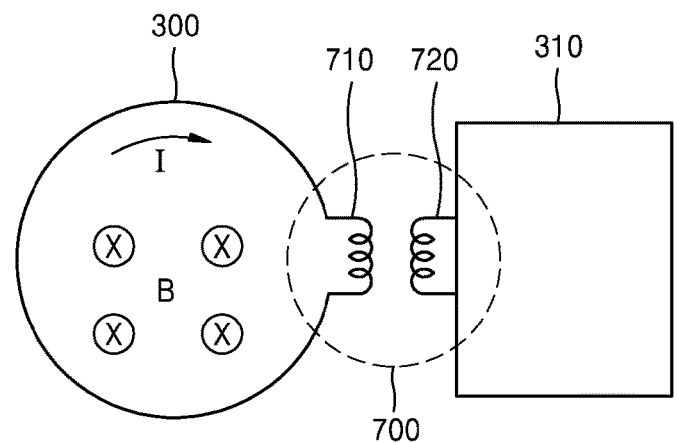
FIGS. 7A and 7B illustrate views of the RF receiving coil unit including a transformer according to an embodiment.
Figure 7B:
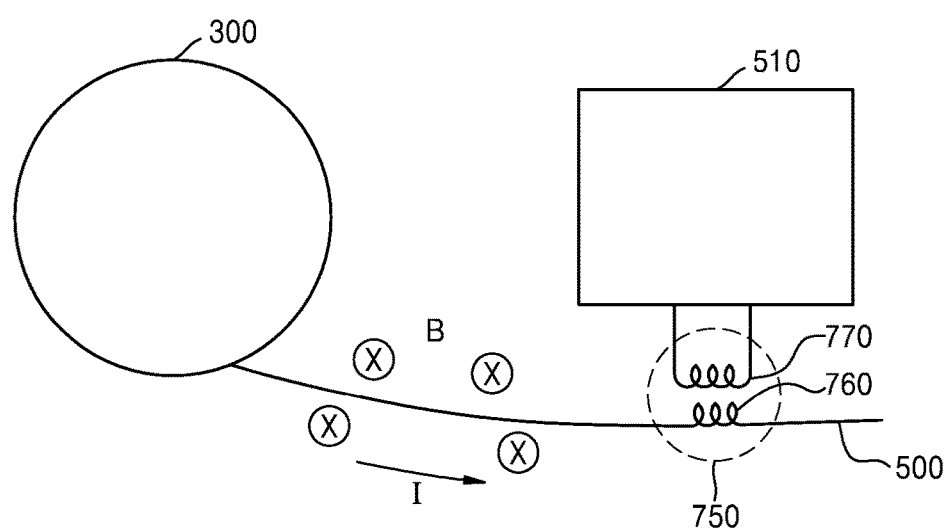

FIGS. 7A and 7B illustrate views of the RF receiving coil unit 210 including a transformer 700 according to an embodiment. Referring to FIG. 7A, the RF receiving coil unit 210 may include the RF coil 300 and the first circuit 310 configured to monitor current flowing through the RF coil 300. In an embodiment, the first circuit 310 may monitor current flowing through the RF coil 300 by using the transformer 700.

For example, the RF coil 300 and the first circuit 310 may respectively include a first coil 710 and a second coil 720. In an embodiment, the first circuit 310 may include a probe (not shown) including only the second coil 720.

The RF receiving coil unit 210 may include the transformer 700 including the first coil 710 and the second coil 720. The transformer 700 may operate by using magnetic coupling between the first coil 710 and the second coil 720.

For example, current may be generated due to electromagnetic induction in the RF coil 300. Current induced in the RF coil 300 may pass through the first coil 710. Accordingly, a magnetic field may be generated due to electromagnetic induction in the first coil 710.

The magnetic field generated in the first coil 710 may pass through the second coil 720. Accordingly, current may be generated due to electromagnetic induction in the second coil 720. The first circuit 310 may monitor current flowing through the RF coil 300 by using the current generated in the second coil 720.

For example, the first circuit 310 may include an ammeter or a voltmeter. Also, the first circuit 310 may include a voltage-current converter. In another embodiment, the first circuit 310 may include a comparator for comparing an intensity of current flowing through the first circuit 310 with a predetermined threshold value.

The first circuit 310 may measure a value of current flowing through the RF coil 300 by measuring a value of current flowing through the first circuit 310. In another embodiment, the first circuit 310 may indirectly compare an intensity of current flowing through the RF coil 300 with a predetermined threshold value by comparing an intensity of current flowing through the first circuit 310 with a predetermined threshold value.

Referring to FIG. 7B, the RF receiving coil unit 210 may include the RF coil 300, the cable 500 configured to transmit a signal received by the RF coil 300, and the third circuit 510 configured to monitor current flowing through the cable 500. In an embodiment, the third circuit 510 may monitor current flowing through the cable 500 by using a transformer 750.

For example, the cable 500 and the third circuit 510 may respectively include a third coil 760 and a fourth coil 770. In an embodiment, the third circuit 510 may include a probe (not shown) including the fourth coil 770.

The RF receiving coil unit 210 may include the transformer 750 including the third coil 760 and the fourth coil 770. The transformer 750 may operate by using magnetic coupling between the third coil 760 and the fourth coil 770.

For example, current may be generated due to electromagnetic induction in the cable 500. The current induced in the cable 500 may pass through the third coil 760. Accordingly, a magnetic field may be generated due to electromagnetic induction in the third coil 760.

The magnetic field generated in the third coil 760 may pass through the fourth coil 770. Accordingly, current may be generated due to electromagnetic induction in the fourth coil 770. The third circuit 510 may monitor current flowing through the cable 500 by using the current generated in the fourth coil 770.

For example, the third circuit 510 may include an ammeter or a voltmeter. Also, the third circuit 510 may include a voltage-current converter. In another embodiment, the third circuit 510 may include a comparator for comparing an intensity of current flowing through the third circuit 510 with a predetermined threshold value.

The third circuit 510 may measure a value of current flowing through the cable 500 by measuring a value of current flowing through the third circuit 510. In another embodiment, the third circuit 510 may indirectly compare an intensity of current flowing through the cable 500 with a predetermined threshold value by comparing an intensity of current flowing through the third circuit 510 with a predetermined threshold value.

Figure 8A:
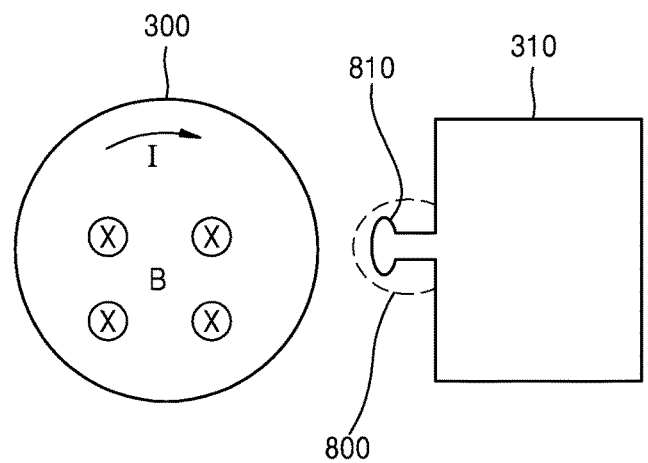
FIGS. 8A and 8B illustrate views of the RF receiving coil unit including a loop according to an embodiment.
Figure 8B:
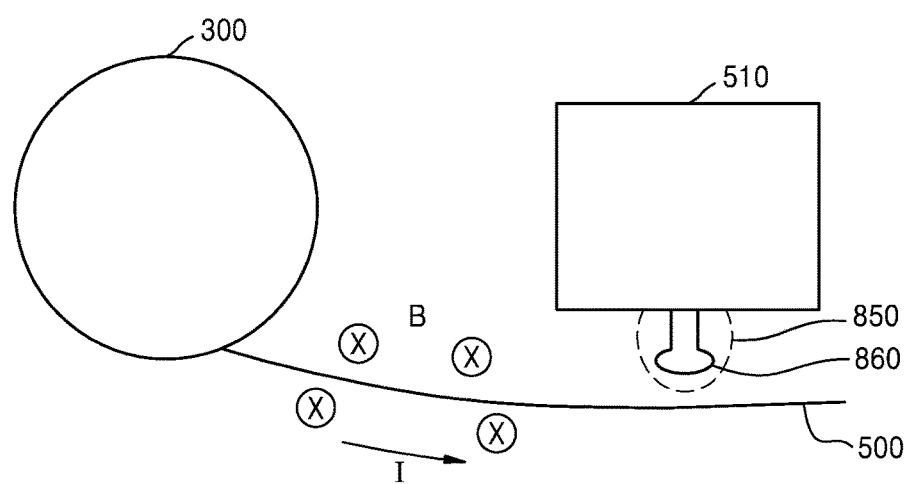

FIGS. 8A and 8B illustrate views of the RF receiving coil unit 210 including a coil element according to an embodiment. Referring to FIG. 8A, the RF receiving coil unit 210 may include the RF coil 300 and the first circuit 310 configured to monitor current flowing through the RF coil 300. In an embodiment, the first circuit 310 may monitor current flowing through the RF coil 300 by using a loop 810.

In an embodiment, the first circuit 310 may include a probe 800 including the loop 810. For example, current may be generated due to electromagnetic induction in the RF coil 300. Accordingly, a magnetic field may be generated due to electromagnetic induction in the RF coil 300.

The magnetic field generated in the RF coil 300 may pass through the loop 810. Accordingly, current may be generated due to electromagnetic induction in the loop 810. The first circuit 310 may monitor current flowing through the RF coil 300 by using the current generated in the loop 810.

For example, the first circuit 310 may include an ammeter or a voltmeter. Also, the first circuit 310 may include a voltage-current converter. In another embodiment, the first circuit 310 may include a comparator for comparing an intensity of current flowing through the first circuit 310 with a predetermined threshold value.

The first circuit 310 may measure a value of current flowing through the RF coil 300 by measuring a value of current flowing through the first circuit 310. In another embodiment, the first circuit 310 may indirectly compare an intensity of current flowing through the RF coil 300 with a predetermined threshold value by comparing an intensity of current flowing through the first circuit 310 with a predetermined threshold value.

Referring to FIG. 8B, the RF receiving coil unit 210 may include the RF coil 300, the cable 500 configured to transmit signal received by the RF coil 300, and the third circuit 510 configured to monitor current flowing through the cable 500. In an embodiment, the third circuit 510 may monitor current flowing through the cable 500 by using a loop 860.

In an embodiment, the third circuit 510 may include a probe 850 including the loop 860. For example, current may be generated due to electromagnetic induction in the RF coil 300. Accordingly, a magnetic field may be generated due to electromagnetic induction in the RF coil 300.

The magnetic field generated in the RF coil 300 may pass through the loop 860. Accordingly, current may be generated due to electromagnetic induction in the loop 860. The third circuit 510 may monitor current flowing through the cable 500 by using the current generated in the loop 860.

For example, the third circuit 510 may include an ammeter or a voltmeter. Also, the third circuit 510 may include a voltage-current converter. In another embodiment, the third circuit 510 may include a comparator for comparing an intensity of current flowing through the third circuit 510 with a predetermined threshold value.

The third circuit 510 may measure a value of current flowing through the cable 500 by measuring a value of current flowing through the third circuit 510. In another embodiment, the third circuit 510 may indirectly compare an intensity of current flowing through the cable 500 with a predetermined threshold value by comparing an intensity of current flowing through the third circuit 510 with a predetermined threshold value.

Figure 9A:
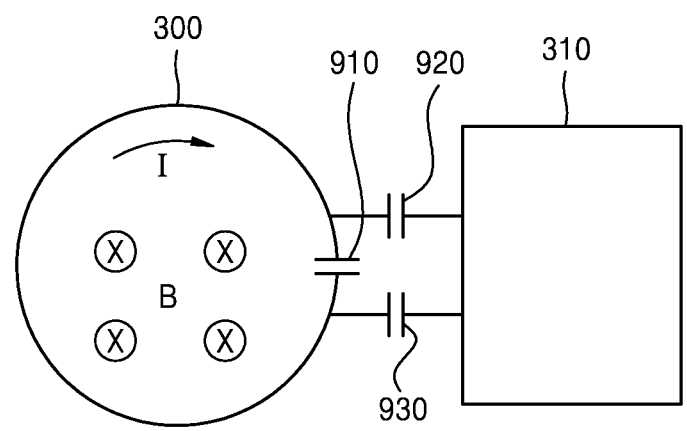
FIGS. 9A and 9B illustrate views of the RF receiving coil unit configured to monitor current flowing through an RF coil by using electric coupling according to an embodiment.
Figure 9B:
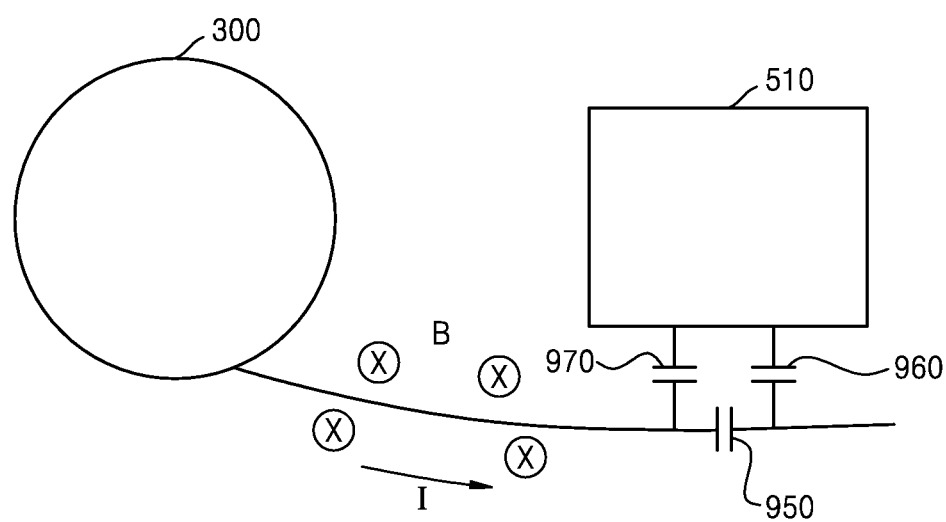

FIGS. 9A and 9B illustrate views of the RF receiving coil unit 210 configured to monitor current flowing through the RF coil 300 by using electric coupling according to an embodiment. Referring to FIG. 9A, the RF receiving coil unit 210 may include the RF coil 300 and the first circuit 310 configured to monitor current flowing through the RF coil 300.

In an embodiment, the RF coil 300 may include a capacitor 910. The first circuit 310 may measure a voltage drop before and after the capacitor 910. The first circuit 310 may monitor current flowing through the first circuit 310 by using the voltage drop before and after the capacitor 910.

In an embodiment, the first circuit 310 may measure a voltage drop before and after the capacitor 910 by using capacitors 920 and 930. However, a method used to measure a voltage drop is not limited thereto.

The first circuit 310 may be directly connected to the RF coil 300 by using the capacitors 920 and 930. The capacitors 920 and 930 of the first circuit 310 may be located before and after the capacitor 910.

In an embodiment, the first circuit 310 may include an ammeter or a voltmeter. Also, the first circuit 310 may include a voltage-current converter. In another embodiment, the first circuit 310 may include a comparator for comparing an intensity of current flowing through the first circuit 310 with a predetermined threshold value.

The first circuit 310 may measure a value of current flowing through the RF coil 300 by measuring a value of current flowing through the first circuit 310. In another embodiment, the first circuit 310 may indirectly compare an intensity of current flowing through the RF coil 300 with a predetermined threshold value by comparing an intensity of current flowing through the first circuit 310 with a predetermined threshold value.

Referring to FIG. 9B, the RF receiving coil unit 210 may include the RF coil 300, the cable 500 configured to transmit a signal received by the RF coil 300, and the third circuit 510 configured to monitor current flowing through the cable 500.

In an embodiment, the cable 500 may include a capacitor 950. The third circuit 510 may measure a voltage drop before and after the capacitor 950. The third circuit 510 may monitor current flowing through the third circuit 510 by using the voltage drop before and after the capacitor 950.

In an embodiment, the third circuit 510 may measure a voltage drop before and after the capacitor 950 by using capacitors 960 and 970. However, a method used to measure a voltage drop is not limited thereto.

The third circuit 510 may be directly connected to the cable 500 by using the capacitors 960 and 970. The capacitors 960 and 970 of the third circuit 510 may be respectively located before and after the capacitor 950.

In an embodiment, the third circuit 510 may include an ammeter or a voltmeter. Also, the third circuit 510 may include a voltage-current converter. In another embodiment, the third circuit 510 may include a comparator for comparing an intensity of current flowing through the third circuit 510 with a predetermined threshold value.

The third circuit 510 may measure a value of current flowing through the cable 500 by measuring a value of current flowing through the third circuit 510. In an embodiment, the third circuit 510 may compare an intensity of current flowing through the cable 500 with a predetermined threshold value by comparing an intensity of current flowing through the third circuit 510 with a predetermined threshold value.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A radio frequency (RF) receiving coil unit for a magnetic resonance imaging (MRI) system, the RF receiving coil unit comprising:
   an RF coil;
   a first circuit configured to comprise a first coil and obtain a bias control signal in response to a comparison result between a current flowing through the RF coil and a predetermined threshold value by using an electromagnetic coupling between the RF coil and the first coil; and
   a second circuit configured to obtain a signal for stopping scanning using a PIN bias switch based on the bias control signal.

2. A radio frequency (RF) receiving coil unit for a magnetic resonance imaging (MRI) system, the RF receiving coil unit comprising:
   an RF coil;
   a cable configured to transmit a signal received by the RF coil; and
   a first circuit comprising a first coil and configured to obtain a bias control signal in response to a comparison result between a current flowing through the cable by using electromagnetic coupling between the cable and the first coil; and
   a second circuit configured to obtain a signal for stopping scanning using a PIN bias switch based on the bias control signal.

3. A method for a magnetic resonance imaging (MRI), comprising:
   transmitting, by a cable, a signal received by a radio frequency (RF) coil;
   obtaining, by a first circuit, a bias control signal in response to a comparison result between a current flowing through the cable by using electromagnetic coupling between the cable and the first coil included in the first circuit; and
   obtaining, by a second circuit, a signal for stopping scanning using a PIN bias switch based on the bias control signal.

4. The RF receiving coil unit of claim 1, wherein the first circuit is further configured to obtain the bias control signal using a value of the current flowing through the first coil.

5. The RF receiving coil unit of claim 1, further comprising a transformer configured to electromagnetically connect the RF coil and the first circuit.

6. The RF receiving coil unit of claim 1, wherein the first circuit comprises a probe comprising a loop, and wherein the first circuit is further configured to obtain a bias control signal by using magnetic coupling between the RF coil and the loop.

7. The RF receiving coil unit of claim 1, wherein the circuit is further configured to obtain a bias control signal based on a voltage drop across a capacitor included in the RF coil.

8. The RF receiving coil unit of claim 2, wherein the first circuit is further configured to obtain the bias control signal using a value of the current flowing through the first coil.

9. The RF receiving coil unit of claim 2, wherein the first circuit is further configured to obtain the bias control signal in response to a comparison result between an intensity of the current flowing through the first coil with a predetermined threshold value.

10. The RF receiving coil unit of claim 2, further comprising a transformer configured to electromagnetically connect the cable and the first circuit.

11. The RF receiving coil unit of claim 2, wherein the first circuit comprises a probe comprising a loop, and wherein the first circuit is further configured to obtain a bias control signal based on the current flowing through the RF coil by using magnetic coupling between the cable and the loop.

12. The RF receiving coil unit of claim 2, wherein the first circuit is further configured to obtain a bias control signal based on a voltage drop across a capacitor included in the cable.

13. The method of claim 3, further comprising obtaining, by the first circuit, the bias control signal in response to a comparison result between an intensity of the current flowing through the first coil with a predetermined threshold value.

14. The method of claim 3, further comprising electromagnetically connecting, by a transformer, the cable and the first circuit.

15. The method of claim 3, wherein the first circuit comprises a probe comprising a loop, and further comprising:
   obtaining, by the first circuit, the bias control signal based on the current flowing through the RF coil by using magnetic coupling between the cable and the loop.

* * * * *